(12) United States Patent
Fukagawa et al.

(10) Patent No.: US 10,163,986 B2
(45) Date of Patent: Dec. 25, 2018

(54) ELECTRO-OPTICAL DEVICE, METHOD FOR MANUFACTURING ELECTRO-OPTICAL DEVICE, AND ELECTRONIC APPARATUS

(71) Applicant: SEIKO EPSON CORPORATION, Tokyo (JP)

(72) Inventors: Takefumi Fukagawa, Fujimi-machi (JP); Takeshi Koshihara, Matsumoto (JP); Naotaka Kubota, Chino (JP); Suguru Akagawa, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/812,177

(22) Filed: Nov. 14, 2017

(65) Prior Publication Data

US 2018/0138244 A1   May 17, 2018

(30) Foreign Application Priority Data

Nov. 15, 2016   (JP) .................................. 2016-222730

(51) Int. Cl.
    *H05B 33/04*    (2006.01)
    *H01L 27/32*    (2006.01)
    *H01L 51/56*    (2006.01)
    *H01L 51/52*    (2006.01)

(52) U.S. Cl.
    CPC .......... *H01L 27/322* (2013.01); *H01L 51/524* (2013.01); *H01L 51/5271* (2013.01); *H01L 51/56* (2013.01)

(58) Field of Classification Search
    CPC ... H01L 27/3206; H01L 27/322; H01L 27/32; H05B 33/04
    See application file for complete search history.

(56) References Cited

U.S. PATENT DOCUMENTS

| | | |
|---|---|---|
| 2003/0107314 A1 | 6/2003 | Urabe et al. |
| 2009/0215352 A1 | 8/2009 | Nishikawa et al. |
| 2012/0038267 A1 | 2/2012 | Hanamura et al. |
| 2013/0020934 A1 | 1/2013 | Iwasaki et al. |
| 2014/0117842 A1* | 5/2014 | Hanamura ............ H01L 27/322 313/504 |
| 2015/0236074 A1 | 8/2015 | Akagawa et al. |

FOREIGN PATENT DOCUMENTS

| | | |
|---|---|---|
| JP | 2003-234186 A | 8/2003 |
| JP | 2004-227851 A | 8/2004 |
| JP | 2007-279101 A | 10/2007 |
| JP | 2010-237384 A | 10/2010 |
| JP | 2012-038677 A | 2/2012 |
| JP | 2013-026064 A | 2/2013 |
| JP | 2015-153607 A | 8/2015 |

* cited by examiner

*Primary Examiner* — Changhyun Yi
(74) *Attorney, Agent, or Firm* — Oliff PLC

(57) ABSTRACT

There is provided an electro-optical device including a light-emitting element, a sealing layer that covers the light-emitting element, a first color filter transmits light in a first wavelength region, and a second color filter that is formed on the sealing layer and the first color filter and transmits light in a second wavelength region, in which the light in the first wavelength region has higher visibility than the light in the second wavelength region, and the first color filter is first formed on the sealing layer.

11 Claims, 8 Drawing Sheets

ELECTRO-OPTICAL DEVICE, METHOD FOR MANUFACTURING ELECTRO-OPTICAL DEVICE, AND ELECTRONIC APPARATUS

BACKGROUND

1. Technical Field

The present invention relates to an electro-optical device, a method for manufacturing an electro-optical device, and an electronic apparatus.

2. Related Art

In an electro-optical device including a light-emitting element such as an organic electro luminescent (EL) element, in order to realize color display, a configuration is known in which a color filter that transmits light in a desired wavelength region is provided on a sealing layer that covers the light-emitting element. For example, in JP-A-2010-237384 and JP-A-2004-227851, a configuration in which a red color filter for transmitting red light is stacked on a sealing layer covering a light-emitting element, a green color filter for transmitting green light is stacked on the sealing layer and the red color filter, and a blue color filter that transmits blue light is stacked on the sealing layer, the red color filter, and the green color filter is disclosed.

By the way, in the process of forming a color filter, it is common to suppress the temperature of the process to a low temperature (for example, 110 degrees or less) in order to prevent deterioration of the light-emitting element due to heat. However, in a case where the color filter is formed at a low temperature, the bonding strength between the color filter and the sealing layer becomes weaker as compared with the case where the color filter is formed at a high temperature. Therefore, after forming the color filter, a part or all of the color filter may be peeled off from the sealing layer in some cases.

In particular, in a case where peeling-off occurs in a color filter that transmits light with high visibility, for example, a green color filter that transmits green light, there is a problem that the possibility that the peeling-off of the color filter is visually recognized as a color change becomes higher as compared with the case where peeling-off occurs in a color filter that transmits light with low visibility.

SUMMARY

An advantage of some aspects of the invention is to provide a technique capable of reducing the possibility that a color change due to peeling-off of a color filter is visually recognized.

According to an aspect of the invention, there is provided an electro-optical device including a light-emitting element, a sealing layer that covers the light-emitting element, a first color filter and transmits light in a first wavelength region, and a second color filter that is formed on the sealing layer and the first color filter and transmits light in a second wavelength region, in which the light in the first wavelength region has higher visibility than the light in the second wavelength region, and the first color filter is first formed on the sealing layer.

According to the aspect of the invention, at least a part of the first color filter may be protected by the second color filter by forming the second color filter that transmits light with low visibility on the first color filter that transmits light with high visibility. According to the invention, it is possible to reduce the possibility of peeling-off in the first color filter while increasing the possibility of peeling-off in the second color filter as compared with the case where the first color filter is formed on the second color filter. Then, the possibility that peeling-off of the first color filter is visually recognized as a color change is higher than the possibility that peeling-off of the second color filter is visually recognized as a color change. Therefore, according to the invention, it is possible to reduce the possibility that the peeling-off is recognized as a color change in a case where peeling-off occurs in the color filter layer including the first color filter and the second color filter.

The above-described electro-optical device may include a third color filter transmits light in a third wavelength region, in which the light in the first wavelength region has higher visibility than the light in the third wavelength region, and the third color filter is formed on the sealing layer, the first color filter, and the second color filter.

According to this aspect, at least a part of the first color filter may be protected by the second color filter and the third color filter by forming the second color filter and the third color filter that transmit light with low visibility on the first color filter that transmits light with high visibility. Therefore, it is possible to relatively reduce the probability of peeling-off occurring in the first color filter with respect to the probability of peeling-off occurring in the color filter layer including the first color filter, the second color filter, and the third color filter. In this way, it is possible to reduce the possibility that the peeling-off is visually recognized as a color change in a case where peeling-off occurs in the color filter layer.

In the electro-optical device described above, the light in the first wavelength region may be green light, the light in the second wavelength region may be blue light, and the light in the third wavelength region may be red light.

According to this aspect, at least a part of the first color filter may be protected by the second color filter and the third color filter by forming the second color filter that transmits blue light with lower visibility compared to green light and the third color filter that transmits red light with lower visibility compared to green light on the first color filter that transmits green light with high visibility. Therefore, it is possible to reduce the possibility that the peeling-off is visually recognized as a color change in a case where peeling-off occurs in the color filter layer.

In the electro-optical device described above, the first color filter and the second color filter and third color filter satisfies the following relation, Zg<Zb<Zr, where a maximum value of the thickness of the first color filter is Zg, a maximum value of the thickness of the second color filter is Zb, a maximum value of the thickness of the third color filter is Zr.

According to this aspect, since the second color filter is made thicker than the first color filter, it is possible to reduce the possibility that the peeling-off is recognized as a color change even if peeling-off occurs in the second color filter. Similarly, since the third color filter is made thicker than the second color filter, it is possible to reduce the possibility that the peeling-off is recognized as a color change even if peeling-off occurs in the third color filter.

The electro-optical device includes a convex portion that is provided between the sealing layer and the first color filter, that is, between the sealing layer and the second color filter.

According to this aspect, it is possible to suppress deterioration in display quality due to the fact that the second color filter is formed at a position where the first color filter is to be formed and the first color filter is formed at a position where the second color filter is to be formed.

In the electro-optical device described above, the convex portion may include a light-transmitting photosensitive resin material, and the first color filter may include a coloring material and the photosensitive resin material.

According to this aspect, since the first color filter and the convex portion are formed using the same photosensitive resin material, it is possible to increase the bonding strength of the first color filter and the convex portion and it is possible to reduce the possibility that the first color filter peels off from the sealing layer as compared with the case where the first color filter and the convex portion are formed using different materials.

In addition, according to another aspect of the invention, there is provided a method for manufacturing an electro-optical device including: forming a first color filter that transmits light in the first wavelength region on a sealing layer that covers the light-emitting element, forming a second color filter that transmits light in the second wavelength region on the sealing layer and the first color filter, and forming a third color filter that transmits light in a third wavelength region on the sealing layer, the first color filter, and the second color filter, in which the light in the first wavelength region has higher visibility than the light in the second wavelength region and the light in the third wavelength region.

According to the aspect of the invention, since at least a part of the first color filter is protected by the second color filter and the possibility of peeling-off in the first color filter may be reduced, it is possible to reduce the possibility that the peeling-off is visually recognized as a color change in a case where peeling-off occurs in the color filter layer including the first color filter and the second color filter.

Furthermore, in addition to the electro-optical device, the invention may be conceived as an electronic apparatus equipped with the electro-optical device. Typical examples of the electronic apparatus include display devices such as a head-mounted display (HMD) and an electronic viewfinder.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments for carrying out the invention will be described with reference to the drawings. However, in each view, the dimensions and the scale of each unit are appropriately different from the actual ones. In addition, since the embodiments described below are preferred specific examples of the invention, various technically preferable limitations are given, but in the following description, the scope of the invention is not limited to these forms unless otherwise stated to limit the invention.

A. EMBODIMENT

Hereinafter, an electro-optical device 1 according to the present embodiment will be described.

1. Outline of Electro-Optical Device

Figure 1:
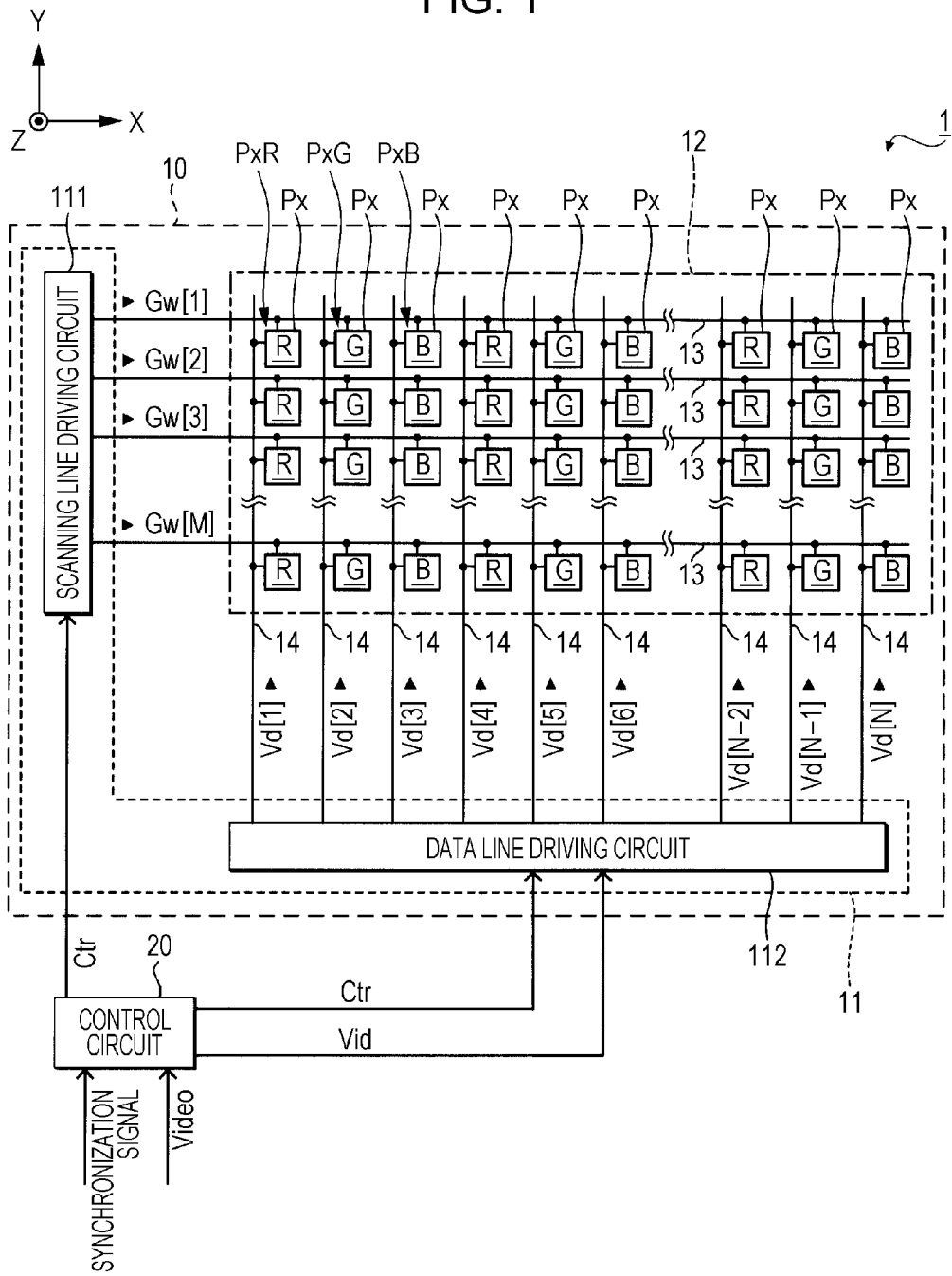
FIG. 1 is a block view showing an example of a configuration of an electro-optical device according to an embodiment of the invention.

FIG. 1 is a block view showing an example of a configuration of an electro-optical device 1 according to the embodiment.

As shown in FIG. 1, the electro-optical device 1 includes a display panel 10 having a plurality of pixels Px and a control circuit 20 controlling the operation of the display panel 10.

Digital image data Video is supplied to the control circuit 20 from a host device (not shown) synchronously with the synchronization signal. Here, the image data Video is digital data that defines a gradation level to be displayed by each pixel Px of the display panel 10. In addition, the synchronization signal is a signal including a vertical synchronization signal, a horizontal synchronization signal, a dot clock signal, and the like.

The control circuit 20 generates a control signal Ctr for controlling the operation of the display panel 10 based on the synchronization signal and supplies the generated control signal Ctr to the display panel 10. In addition, the control circuit 20 generates an analog image signal Vid based on the image data Video and supplies the generated image signal Vid to the display panel 10. Here, the image signal Vid is a signal that defines the luminance of the light-emitting element of the pixel Px so that each pixel Px displays the gradation specified by the image data Video.

As shown in FIG. 1, the display panel 10 includes M scanning lines 13 extending in an X direction and N data lines 14 extending in a Y direction, a display unit 12 having M×N pixels Px arranged in a matrix of M rows×N columns corresponding to the intersections of the scanning line 13 of M rows and the data line 14 of N columns, and a driving circuit 11 that drives the display unit 12 (M is a natural number of 1 or more. N is a natural number of 3 or more).

Hereinafter, in order to distinguish the plurality of pixels Px, a plurality of scanning lines 13, and a plurality of data lines 14 from each other, from a +Y direction to a −Y direction, the rows are referred to as a first row, a second row, . . . , an M-th, and from a −X direction to a +X direction, the columns are referred to as a first column, a second column, . . . , an N-th column.

The plurality of pixels Px provided on the display unit 12 include a pixel PxR capable of displaying red (R), a pixel PxG capable of displaying green (G), and a pixel PxB capable of displaying blue (B). Then, in the embodiment, a case where k is a variable representing a natural number of a multiple of 3 that satisfies 3≤k≤N, the pixel PxR is arranged in a (k−2)th column among the first column to the N-th column, the pixel PxG is arranged in the (k−1)th column, and the pixel PxB is arranged in the k-th column is assumed as an example.

As shown in FIG. 1, the driving circuit 11 includes a scanning line driving circuit 111 and a data line driving circuit 112.

The scanning line driving circuit 111 sequentially scans (selects) the scanning lines 13 of the first row to the M-th row. Specifically, the scanning line driving circuit 111 sequentially selects the scanning lines 13 for each horizontal scanning period in units of one frame by setting scanning signals Gw[1 to Gw[M to be output to the respective scanning lines 13 of the first row to the M-th row to a predetermined selection potential sequentially in each horizontal scanning period. In other words, the scanning line driving circuit 111 selects the scanning line 13 of the m-th row in the m-th horizontal scanning period of one frame period by setting the scanning signal Gw[m to be output to the scanning line 13 of the m-th row to the predetermined selection potential (m is a natural number satisfying 1≤m≤M). The period of one frame is a period during which the electro-optical device 1 displays one image.

Based on the image signal Vid and the control signal Ctr supplied from the control circuit 20, the data line driving circuit 112 generates analog data signals Vd[1 to Vd[N that define the gradation to be displayed by each pixel P and outputs the generated data signals Vd[1 to Vd[N to the N data lines 14 for each horizontal scanning period. In other words, in each horizontal scanning period, the data line driving circuit 112 outputs a data signal Vd[n (n is a natural number satisfying 1≤n≤N) to the data line 14 of the n-th column.

In the embodiment, the image signal Vid output from the control circuit 20 is an analog signal, but the image signal Vid output from the control circuit 20 may be a digital signal. In this case, the data line driving circuit 112 converts the image signal Vid to generate analog data signals Vd[1 to Vd[N.

Figure 2:
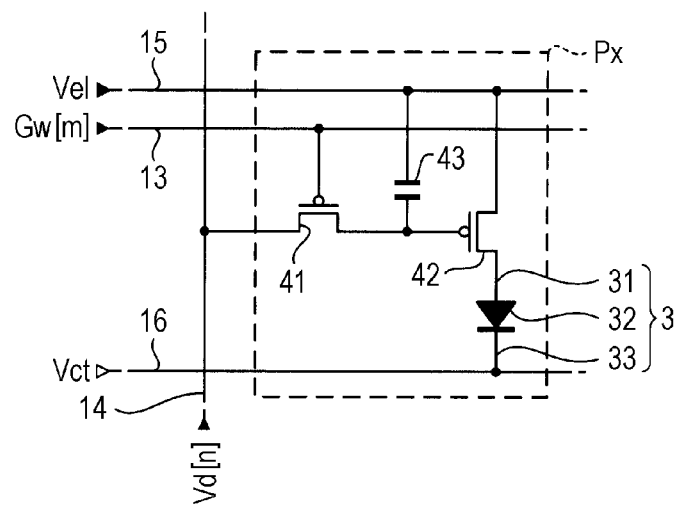
FIG. 2 is an equivalent circuit view showing an example of a configuration of a pixel.

FIG. 2 is an equivalent circuit view showing an example of a configuration of a pixel circuit 100 provided corresponding to each pixel Px in a one-to-one correspondence. In the embodiment, it is assumed that a plurality of pixel circuits 100 corresponding to the plurality of pixels Px are electrically identical to each other. In FIG. 2, the pixel circuit 100 provided corresponding to the pixel Px in the m-th row and the n-th column will be described by way of example.

The pixel circuit 100 includes a light-emitting element 3 included in the pixel Px corresponding to the pixel circuit 100, a P-channel MOS type transistors 41 and 42, and a storage capacitor 43. One or both of the transistors 41 and 42 may be N-channel MOS type transistors. In addition, the transistors 41 and 42 may be thin film transistors or field effect transistors.

The light-emitting element 3 includes a pixel electrode 31, a light-emitting function layer 32, and a counter electrode 33. The pixel electrode 31 functions as an anode for supplying holes to the light-emitting function layer 32. The counter electrode 33 is electrically connected to a feeder line 16 set at a potential Vct which is a power source potential on the low potential side of the pixel circuit 100 and functions as a cathode for supplying electrons to the light-emitting function layer 32. Then, the holes supplied from the pixel electrode 31 and the electrons supplied from the counter electrode 33 are coupled to the light-emitting function layer 32, and the light-emitting function layer 32 emits white light.

As will be described later in detail, a red color filter 8R is superimposed on the light-emitting element 3 (hereinafter, referred to as a light-emitting element 3R) of the pixel PxR, In t of the pixel PxG, a green color filter 8G is superimposed on the light-emitting element 3 (hereinafter, referred to as a light-emitting element 3G), and a blue color filter 8B is superimposed on a light-emitting element 3 (hereinafter, referred to as a light-emitting element 3B) included in the pixel PxB. Therefore, full-color display is enabled by the pixel PxR, the pixel PxG, and the pixel PxB.

The gate of the transistor 41 is electrically connected to the scanning line 13 of the m-th row, one of the source and the drain is electrically connected to the data line 14 of the n-th column, and the other of the source and the drain is electrically connected to the gate of the transistor 42 and one of the two electrodes included in the storage capacitor 43.

The gate of the transistor 42 is electrically connected to the other of the source or the drain of the transistor 41 and one electrode of the storage capacitor 43, one of the source and the drain is electrically connected to a feeder line 15 set to a potential Vel which is a power source potential on the high potential side of the pixel circuit 100, and the other of the source and the drain is electrically connected to the pixel electrode 31.

In the storage capacitor 43, one of the two electrodes included in the storage capacitor 43 is electrically connected to the other of the source and the drain of the transistor 41 and the gate of the transistor 42, and the other electrode of the two electrodes of the storage capacitor 43 is electrically connected to the feeder line 15. The storage capacitor 43 functions as a storage capacitor for holding the potential of the gate of the transistor 42.

When the scanning line driving circuit 111 sets the scanning signal Gw[m to a predetermined selection potential and selects the scanning line 13 of the m-th row, the transistor 41 provided in the pixel Px of the m-th row and the n-th column is turned on. Then, when the transistor 41 is turned on, the data signal Vd[n is supplied from the data line 14 of the n-th column to the gate of the transistor 42. In this case, the transistor 42 supplies a current corresponding to the potential (to be precise, a potential difference between the gate and the source) of the data signal Vd[n supplied to the gate to the light-emitting element 3. Then, the light-emitting element 3 emits light with luminance corresponding to the magnitude of the current supplied from the transistor 42, that is, luminance corresponding to the potential of the data signal Vd[n.

Thereafter, in a case where the scanning line driving circuit 111 releases the selection of the scanning line 13 of the m-th row and the transistor 41 is turned off, the potential of the gate of the transistor 42 is held by the storage capacitor 43. Therefore, even after the transistor 41 is turned off, the light-emitting element 3 may emit light with luminance corresponding to the data signal Vd[n].

2. Configuration of Display Unit

Hereinafter, the configuration of the display unit 12 according to the embodiment will be described with reference to FIGS. 3 and 4.

Figure 3:
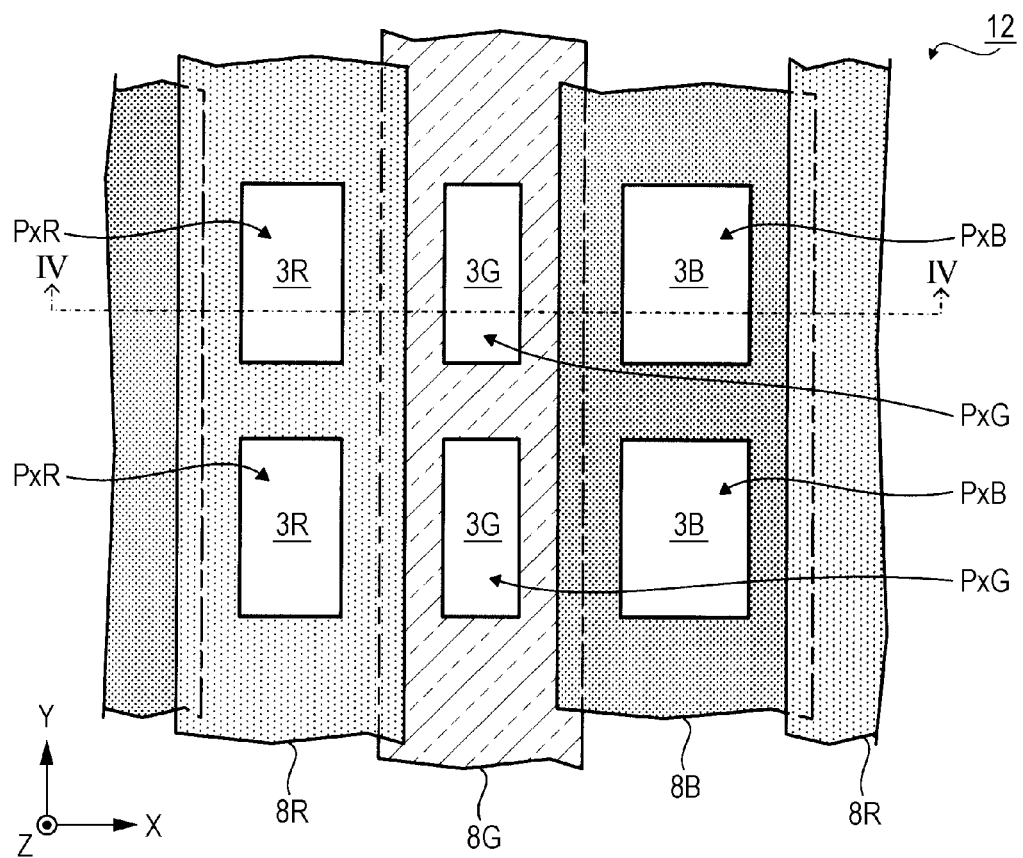
FIG. 3 is a plan view showing an example of a configuration of a display unit.

FIG. 3 is a plan view showing an example of a schematic structure of the display unit 12 according to the embodiment.

Specifically, FIG. 3 shows a case where a part of the display unit 12 is viewed in a plan view from a +Z direction (hereinafter, a +Z direction and a −Z direction are collectively referred to as a "Z-axis direction"), which is a direction in which the electro-optical device 1 emits light. The Z axis direction is a direction crossing the X-axis direction and the Y-axis direction.

As shown in FIG. 3, on the M light-emitting elements 3G (+Z direction) included in the M pixels PxG arranged in the Y axis direction in the (k−1)th column of the display unit 12, the green color filter 8G (an example of a "first color filter") is disposed so as to cover the M light-emitting elements 3G. The color filter 8G transmits green light (an example of "light in a first wavelength region") at which the luminance of light having a wavelength of 540 nm is maximum. In addition, on the M light-emitting elements 3B (+Z direction) included in the M pixels PxG arranged in the Y axis direction in the k-th column of the display unit 12, the blue color filter 8B (an example of a "second color filter") is disposed so as to cover the M light-emitting elements 3B. The color filter 8B transmits blue light (an example of "light in a second wavelength region") at which the luminance of light having a wavelength of 470 nm is maximum. In addition, on the M light-emitting elements 3R (+Z direction) included in the M pixels PxR arranged in the Y axis direction in the (k−2)th column of the display unit 12, the red color filter 8R (an example of a "third color filter") is disposed so as to cover the M light-emitting elements 3B. The color filter 8R transmits red light (an example of "light in the third wavelength region") at which the luminance of light having a wavelength of 610 nm is maximum.

Figure 4:
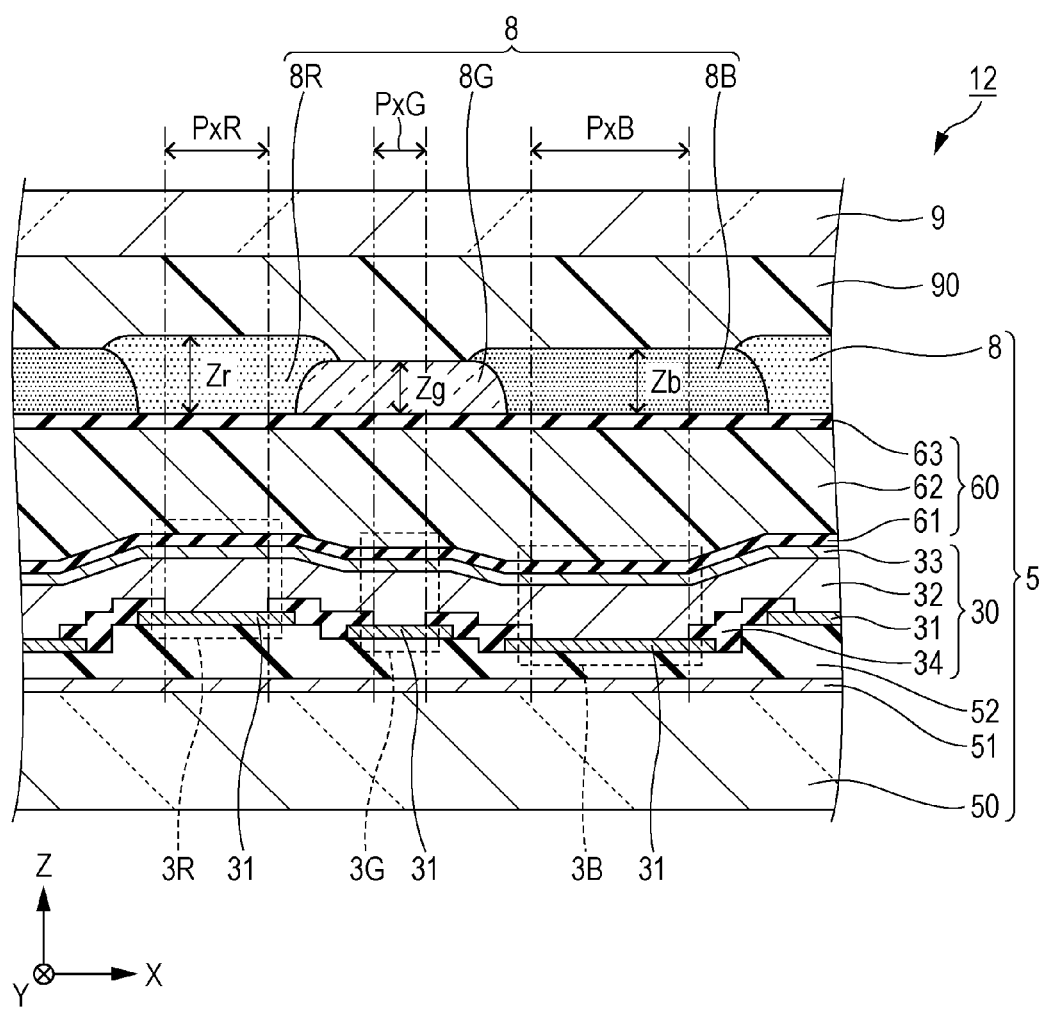
FIG. 4 is a partial cross-sectional view showing an example of the configuration of the display unit.

FIG. 4 is an example of a partial cross-sectional view taken along a line IV-IV in FIG. 3 of the display unit 12, in which a cross section of the pixel PxR, a cross section of the pixel PxG, and a cross section of the pixel PxB are included.

As shown in FIG. 4, the display unit 12 includes an element substrate 5, a counter substrate 9, and an adhesive layer 90 provided between the element substrate 5 and the counter substrate 9. In the embodiment, it is assumed that the electro-optical device 1 is a top emission type in which light is emitted from the counter substrate 9 side (+Z side).

The adhesive layer 90 is a transparent resin layer for bonding the element substrate 5 and the counter substrate 9. The adhesive layer 90 is formed using a transparent resin material such as an epoxy resin or an acrylic resin, for example.

The counter substrate 9 is a transparent substrate disposed on the +Z side of the adhesive layer 90. As the counter substrate 9, for example, a quartz substrate, a glass substrate or the like may be adopted.

The element substrate 5 includes a substrate 50, a reflective layer 51, a distance adjusting layer 52, a light-emitting layer 30, a sealing layer 60, and a color filter layer 8 stacked on the substrate 50. Although details will be described later, the light-emitting layer 30 includes the light-emitting element 3 (3R, 3G, and 3B) described above. The light-emitting element 3 emits light in the +Z direction and the −Z direction. In addition, the color filter layer 8 includes the color filter 8R, the color filter 8G, and the color filter 8B described above.

The substrate 50 is a substrate on which various wirings such as the scanning line 13 and the data line 14, and various circuits such as the driving circuit 11 and the pixel circuit 100 are mounted. The substrate 50 may be any substrate as long as various wirings and various circuits may be mounted. As the substrate 50, for example, a silicon substrate, a quartz substrate, a glass substrate, or the like may be adopted. On the +Z side of the substrate 50, a reflective layer 51 is stacked.

The reflective layer 51 is a constituent element for reflecting the light emitted from the light-emitting element 3 of the light-emitting layer 30 to the +Z direction side. The reflective layer 51 is formed using a material with high reflectance, for example, aluminum, silver or the like. On the +Z side of the reflective layer 51, the distance adjusting layer 52 is stacked.

The distance adjusting layer 52 is an insulating transparent layer for adjusting the optical distance between the light-emitting element 3 and the reflective layer 51 of the light-emitting layer 30. The distance adjusting layer 52 is formed using an insulating transparent material, for example, silicon oxide (SiOx) or the like. On the +Z side of the distance adjusting layer 52, the light-emitting layer 30 is laminated.

The light-emitting layer 30 includes the pixel electrode 31 stacked on the distance adjusting layer 52, an insulating film 34 stacked on the distance adjusting layer 52 and the pixel electrode 31, the light-emitting function layer 32 stacked so as to cover the pixel electrode 31 and the insulating film 34, and the counter electrode 33 stacked on the light-emitting function layer 32.

The pixel electrode 31 is a transparent layer having conductivity formed in an island shape individually for each pixel Px. The pixel electrode 31 is formed using a conductive transparent material, for example, ITO Indium Tin Oxide (ITO), Indium Zinc Oxide (IZO), or the like.

The insulating film 34 is an insulating constituent element arranged so as to cover the peripheral portion of each pixel electrode 31. The insulating film 34 is formed using an insulating material, for example, silicon oxide or the like.

The counter electrode 33 is a conductive constituent element having optical transparency and light reflectivity disposed so as to straddle the plurality of pixels Px. The counter electrode 33 is formed using, for example, an alloy of Mg and Ag or the like.

The light-emitting function layer 32 includes a hole injecting layer, a hole transporting layer, an organic light-emitting layer, and an electron transporting layer and is disposed so as to extend over a plurality of pixels Px. As described above, in the light-emitting function layer 32, holes are supplied from a portion of the pixel electrode 31 that is not covered with the insulating film 34 and emits white light. That is, in the plan view, the portion of the light-emitting layer 30 where the pixel electrode 31 is not covered with the insulating film 34 corresponds to the light-emitting element 3. In addition, in the embodiment, in the plan view, the portion where the light-emitting element 3 is provided is regarded as the pixel Px. In other words, in the plan view, the insulating film 34 is disposed so as to partition the plurality of pixels Px of the display unit 12 from each other. The white light emitted from the light-emitting element 3 is light including red light, green light, and blue light.

In the embodiment, the film thickness of the distance adjusting layer 52 is adjusted so that an optical resonance structure is formed by the reflective layer 51 and the counter electrode 33. Then, the light emitted from the light-emitting function layer 32 is repeatedly reflected between the reflective layer 51 and the counter electrode 33 to amplify the intensity of light having a wavelength corresponding to the optical distance between the reflective layer 51 and the counter electrode 33, and the amplified light is emitted to the +Z side to the counter substrate 9 via the counter electrode 33.

In the embodiment, as an example, the film thickness of the distance adjusting layer 52 is set for each pixel Px so that the light having a wavelength of 610 nm is amplified in the pixel PxR, the light having a wavelength of 540 nm is amplified in the pixel PxG, and the light having a wavelength of 470 nm is amplified in the pixel PxB. For this reason, in the embodiment, red light with the maximum luminance of light having the wavelength of 610 nm is emitted from the pixel PxR, green light with the maximum luminance of light having the wavelength of 540 nm is emitted from the pixel PxG, and blue light with the maximum luminance of the light having the wavelength of 470 nm is emitted from the pixel PxB.

The sealing layer 60 includes a lower sealing layer 61 stacked on the counter electrode 33, a planarizing layer 62 stacked on the lower sealing layer 61, and an upper sealing layer 63 stacked on the planarizing layer 62.

The lower sealing layer 61 and the upper sealing layer 63 are transparent layers having insulating properties and disposed so as to extend over the plurality of pixels Px. The lower sealing layer 61 and the upper sealing layer 63 are constituent elements for inhibiting entry of moisture, oxygen, or the like into the light-emitting layer 30 and are formed using an inorganic material such as silicon oxide (SiOx), silicon nitride (SiNx), or aluminum oxide (AlxOy), for example.

The planarizing layer 62 is a transparent layer disposed so as to straddle the plurality of pixels Px and is a constituent element for providing a flat upper surface (a surface on the +Z side). The planarizing layer 62 is formed using, for example, a resin material such as an epoxy resin, an acrylic resin, a urethane resin, a silicon resin, or an inorganic material such as silicon oxide.

The color filter layer 8 includes the color filter 8R, the color filter 8G, and the color filter 8B.

As shown in FIG. 4, the color filter 8G is formed on the upper sealing layer 63 so as to cover the light-emitting element 3G in a plan view on the +Z side of the light-emitting element 3G. In addition, the color filter 8B is formed on the upper sealing layer 63 and the color filter 8G so as to cover the light-emitting element 3B in a plan view on the +Z side of the light-emitting element 3B. In addition, the color filter 8R is formed on the upper sealing layer 63, the color filter 8G, and the color filter 8R so as to cover the light-emitting element 3R in a plan view on the +Z side of the light-emitting element 3R.

The color filter 8R is formed of a photosensitive resin material containing a red coloring material, the color filter 8G is formed of a photosensitive resin material containing a green coloring material, and the color filter 8B is formed of a photosensitive resin material containing a blue coloring material.

As shown in FIG. 4, the adhesive layer 90 is provided on the +Z side of the color filter layer 8 so as to cover the color filter layer 8, and the counter substrate 9 is provided on the +Z side of the adhesive layer 90.

In the embodiment, as shown in FIG. 4, the color filter layer 8 is formed so that the relationship shown in the following equation (1) is established between a maximum value Zr of the thickness of the color filter 8R in the Z axis direction, a maximum value Zg of the thickness of the color filter 8G in the Z axis direction, and a maximum value Zb of the thickness of the color filter 8B in the Z axis direction.

$$Zg < Zb < Zr \quad (1)$$

More specifically, in the embodiment, as an example, the color filter layer 8 is formed so as to satisfy that the thickness Zr is 1.0 µm≤Zr≤1.5 µm, the thickness Zg is 0.5 µm≤Zg≤1.2 µm, the thickness Zb is 0.8 µm≤Zb≤1.3 µm, and the relationship of the above equation (1).

In addition, the green light transmitted through the color filter 8G has higher visibility than the red light transmitted through the color filter 8R, and the red light transmitted through the color filter 8R has higher visibility than the blue light transmitted through the color filter 8B. For this reason, in the embodiment, when viewed in a plan view, each pixel Px is formed so that the pixel PxR has an area larger than the pixel PxG and the pixel PxB has an area larger than the pixel PxR. Specifically, in the embodiment, each pixel Px is formed so that the relationship shown in the following equation (2) is established between a width Xr of the pixel PxR in an X-axis direction, a width Xg of the pixel PxG in the X-axis direction, and a width Xb of the pixel PxB in the X-axis direction.

$$Xg < Xr < Xb \quad (2)$$

3. Method for Manufacturing Electro-Optical Device

Hereinafter, an example of a method for manufacturing the electro-optical device 1 according to the embodiment will be described with reference to FIGS. 5 to 8.

Figure 5:
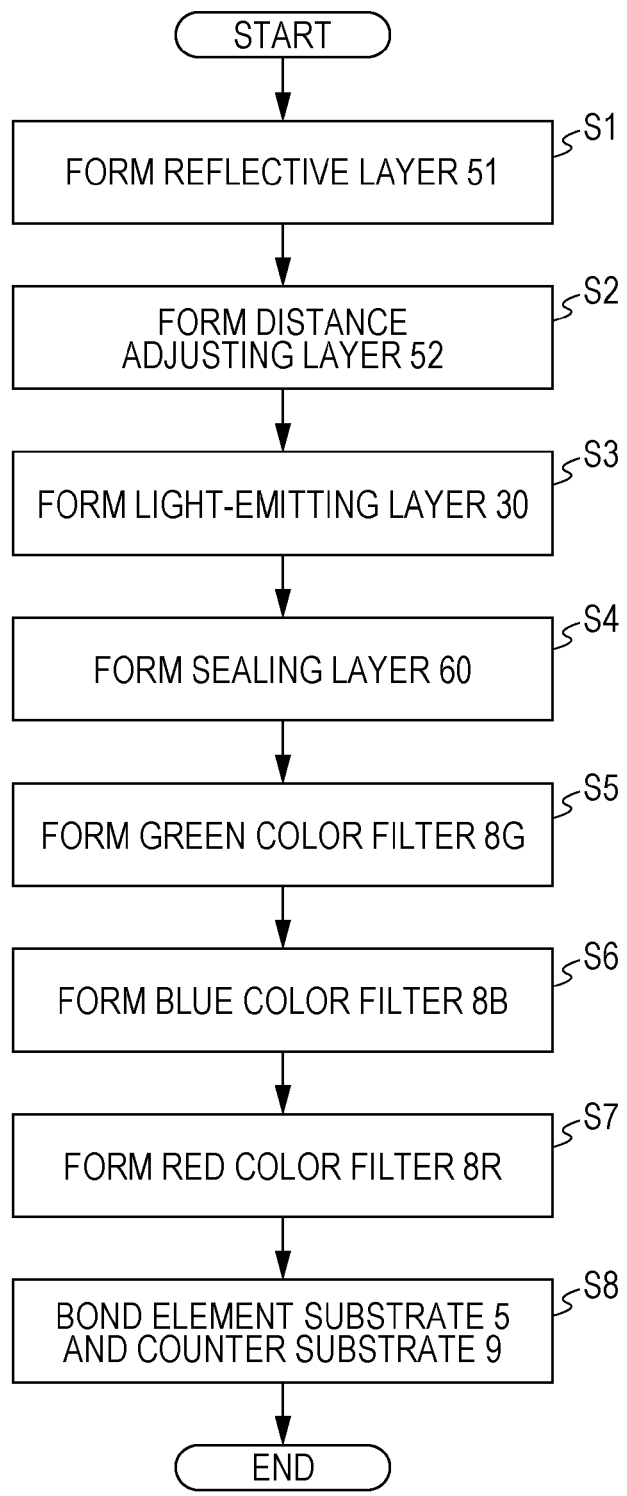
FIG. 5 is a flowchart showing an example of a manufacturing method for the electro-optical device.

FIG. 5 is a flowchart for explaining an example of a method for manufacturing the electro-optical device 1. As shown in FIG. 5, the method for manufacturing the electro-optical device 1 includes forming the reflective layer 51 on the substrate 50 (S1), forming the distance adjusting layer 52 on the reflective layer 51 (S2), forming the light-emitting layer 30 on the distance adjusting layer 52 (S3); forming the sealing layer 60 on the light-emitting layer 30 (S4), forming the color filter 8G on the +Z side of the light-emitting element 3G of the light-emitting layer 30 on the upper sealing layer 63 of the sealing layer 60 (S5), forming the color filter 8B on the +Z side of the light-emitting element 3B having the light-emitting layer 30 on the upper sealing layer 63 and on the color filter 8G (S6), forming the color filter 8R on the +Z side of the light-emitting element 3R having the light-emitting layer 30 on the upper sealing layer 63, the color filter 8G, and the color filter 8B (S7), and forming the adhesive layer 90 on the color filter layer 8 and bonding the element substrate 5 and the counter substrate 9 with the adhesive layer 90 (S8).

An example of steps S5 to S7, which is a manufacturing process of the color filter layer 8 out of the above steps S1 to S8, will be described below.

Figure 6:
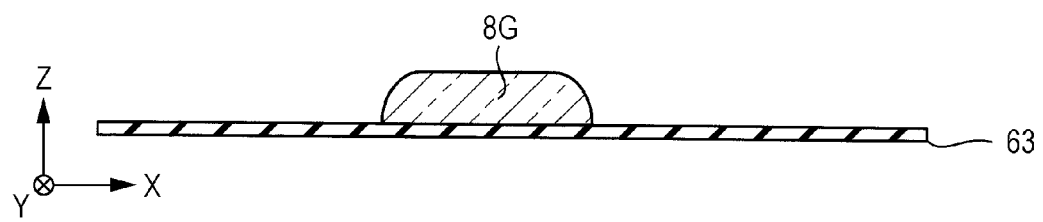
FIG. 6 is an explanatory view for explaining an example of the manufacturing method for the electro-optical device.

In step S5, first, a photosensitive resin material containing a green coloring material is applied onto the upper sealing layer 63 by a spin coating method and dried, whereby a green photosensitive resin layer is formed. Next, a portion of the green photosensitive resin layer forming the color filter 8G is irradiated with light and exposed, and a developing solution or the like is discharged to the photosensitive resin layer, whereby the unexposed photosensitive resin layer is removed. Thereafter, by burning and curing the green photosensitive resin layer, as shown in FIG. 6, the color filter 8G is formed on the upper sealing layer 63.

Figure 7:
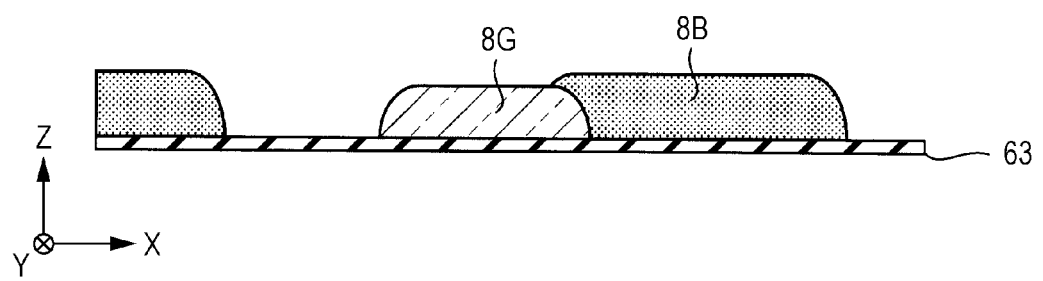
FIG. 7 is an explanatory view for explaining an example of the manufacturing method for the electro-optical device.

In the step S6, first, a photosensitive resin material containing a blue coloring material is applied onto the upper sealing layer 63 and the color filter 8G by the spin coat method and dried, whereby a blue photosensitive resin layer is formed. Next, a portion of the blue photosensitive resin layer forming the color filter 8B is irradiated with light and exposed, and a developing solution or the like is discharged to the photosensitive resin layer, whereby the unexposed photosensitive resin layer is removed. Thereafter, by burning and curing the green photosensitive resin layer, as shown in FIG. 7, the color filter 8B is formed on the upper sealing layer 63 and the color filter 8B.

Figure 8:
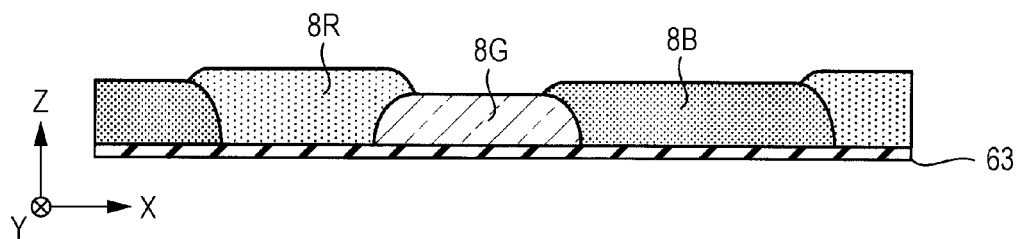
FIG. 8 is an explanatory view for explaining an example of the manufacturing method for the electro-optical device.

In the step S7, first, a photosensitive resin material containing a red coloring material is applied onto the upper sealing layer 63, the color filter 8G, and the color filter 8B by the spin coat method and dried, whereby a red photosensitive resin layer is formed. Next, a portion of the red photosensitive resin layer forming the color filter 8R is irradiated with light and exposed, and a developing solution or the like is discharged to the photosensitive resin layer, whereby the unexposed photosensitive resin layer is removed. Thereafter, by burning and curing the green photosensitive resin layer, as shown in FIG. 8, the color filter 8B is formed on the upper sealing layer 63, the color filter 8G, the color filter 8B, and the color filter 8R.

4. Effect of Embodiment

As described above, the green light transmitted through the color filter 8G has high visibility compared to the blue light transmitted through the color filter 8B or the red light transmitted through the color filter 8R. Therefore, in a case where a part of the color filter 8G, for example, the color filter 8G having a predetermined area in a plan view is peeled off, there is a high possibility that a color change due to peeling-off is visually recognized as compared with the case where the color filter 8B having a predetermined area or the color filter 8R having a predetermined area is peeled off.

In addition, as described above, the area of the color filter 8G in a plan view is smaller than the area of the color filter 8B when viewed in a plan view and the area of the color filter 8R when viewed in a plan view. Therefore, in a case where a part of the color filter 8G, for example, the color filter 8G having a predetermined area in a plan view is peeled off, there is a high possibility that a color change due to peeling-off is visually recognized as compared with the case where the color filter 8B having a predetermined area or the color filter 8R having a predetermined area is peeled off.

That is, the possibility that a color change due to peeling-off of the color filter 8G is visually recognized is higher than the possibility that a color change due to peeling-off of the color filter 8B or the color filter 8R is visually recognized.

On the other hand, in the embodiment, on the sealing layer 60, first, the color filter 8G is formed, the color filter 8B is formed second, and the color filter 8R is formed third. Therefore, at least a part of the color filter 8G is covered with the color filter 8B and the color filter 8R. Therefore, at least a part of the color filter 8G may be protected by the color filter 8B and the color filter 8R.

In this way, according to the embodiment, the possibility of peeling-off the color filter 8G may be reduced as compared with the case where the color filter 8G is not formed on the sealing layer 60 at the beginning. That is, it is possible to suppress the probability (relative probability) of peeling-off occurring in the color filter 8G with respect to the probability of peeling-off occurring in the entire color filter layer 8. In this way, even in a case where peeling-off occurs in the color filter layer 8, the possibility that the peeling-off is visually recognized as a color change may be suppressed.

In addition, while the red light has a high possibility of being recognized as red light even if there is some change in the frequency of the light included in the red light, in a case where the frequency of the light included in the blue light is changed, the blue light has a high possibility of being visually recognized as light of a color other than blue, for example, green light. That is, the blue light has a higher possibility that the fluctuation of the light frequency is visually recognized as a color change as compared with the red light. Therefore, the possibility that a color change due to peeling-off of the color filter 8B is visually recognized is higher than the possibility that a color change due to peeling-off of the color filter 8R is visually recognized.

On the other hand, according to the embodiment, at least a part of the color filter 8B is protected by the color filter 8R by forming the color filter 8R on at least a part of the color filter 8B after forming the color filter 8B. Therefore, according to the embodiment, it is possible to reduce the possibility of peeling-off in the color filter 8B as compared with the case of forming the color filter 8B on the color filter 8R. In this way, even in a case where peeling-off occurs in the color filter layer 8, the possibility that the peeling-off is visually recognized as a color change may be suppressed.

B. MODIFICATION EXAMPLE

Each of the above embodiments may be variously modified. Specific modification embodiments are exemplified below. Two or more embodiments arbitrarily selected from the following examples may be appropriately merged within a range not mutually contradictory. With respect to elements whose functions and functions are the same as those of the embodiment in the modification examples described below, the reference numerals referred to in the above description are used, and the detailed description thereof will be appropriately omitted.

Modification Example 1

In the above embodiment, in the display unit 12, the color filter layer 8 is formed so as to cover the entirety of the sealing layer 60, but the invention is not limited to such an aspect, and in the display unit 12, a convex pattern 7 (an example of "convex portion") may be formed between the sealing layer 60 and the color filter layer 8.

Figure 9:
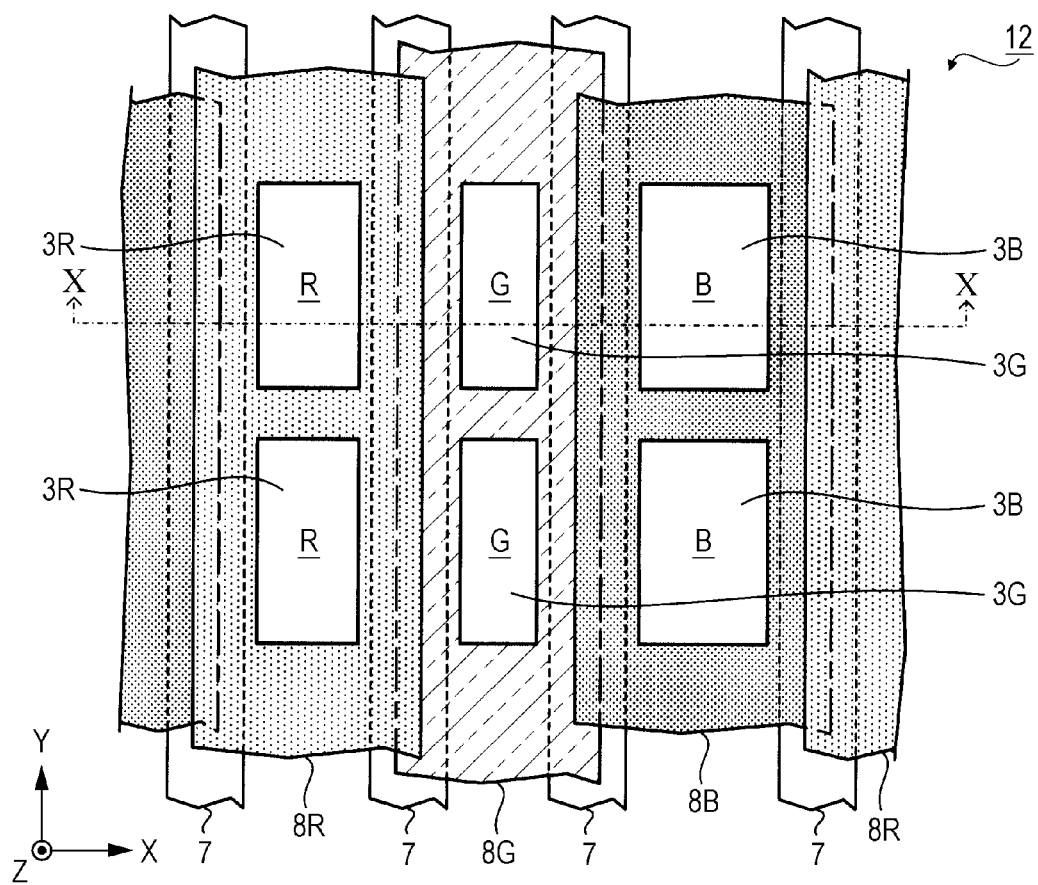
FIG. 9 is a plan view showing an example of a configuration of the display unit according to a modification example 1.

FIG. 9 is a plan view showing an example of a schematic structure of the display unit 12 according to a modification example 1.

As shown in FIG. 9, in the display unit 12 according to the present modification, a plurality of convex patterns 7 extending in the Y axis direction are provided between two light-emitting elements 3 adjacent in the X axis direction. More specifically, in the display unit 12 according to the modification example, (N−1) columns of convex patterns 7 are provided so as to divide the N columns of pixels Px from the first column to the N-th column from each other. However, the convex pattern 7 may be provided on one or both of the −X side than the first row and the +X side than the N-th column.

Figure 10:
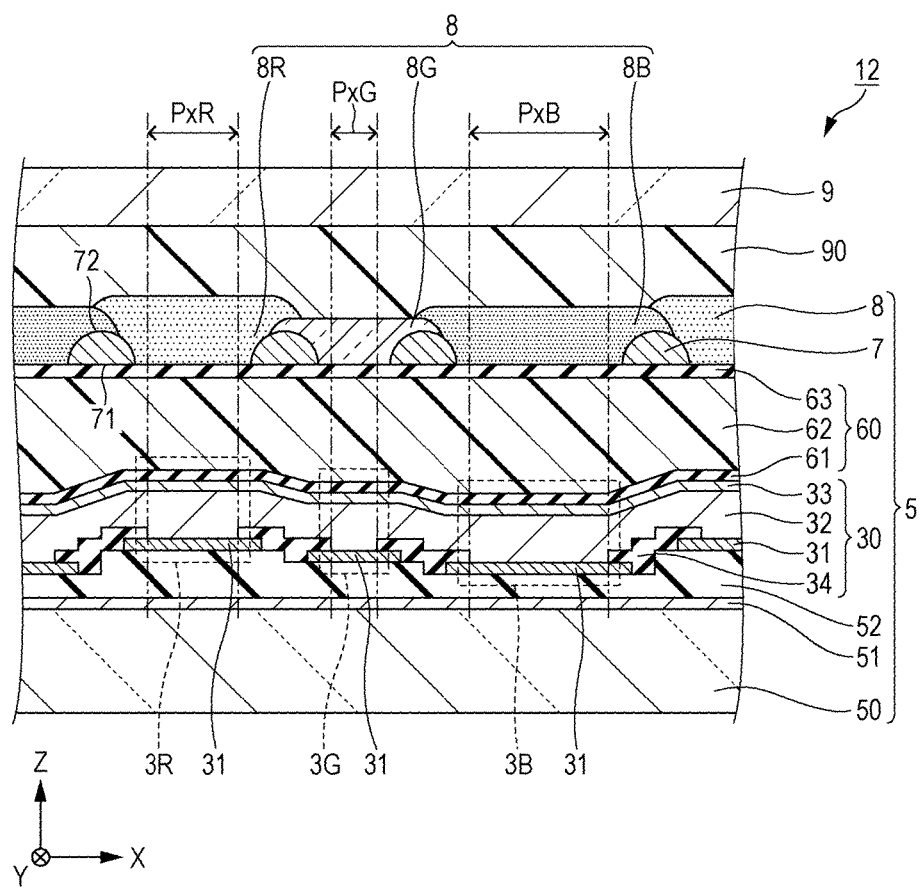
FIG. 10 is a partial cross-sectional view showing an example of the configuration of the display unit according to the modification example 1.

FIG. 10 is an example of a partial cross-sectional view taken along the line X-X in FIG. 9 of the display unit 12 according to modification example 1, in which the cross section of the pixel PxR, the cross section of the pixel PxG, and the cross section of the pixel PxB are included.

The convex pattern 7 is a transparent constituent element formed on the sealing layer 60 and includes a flat bottom surface 71 in contact with the sealing layer 60 and a curved upper surface 72 in contact with the color filter layer 8. The shape of the convex pattern 7 shown in FIG. 10 is an example, and the upper surface 72 of the convex pattern 7 may be a polyhedron or a shape having a corner.

The convex pattern 7 is formed using a transparent photosensitive resin material not containing a coloring material, for example, an acrylic resin. That is, the photosensitive resin material used as the material of the convex pattern 7 is the same material as the main material of the color filter layer 8.

In this modification example, as shown in FIG. 10, the color filter 8G is formed on the upper sealing layer 63 and on the convex pattern 7. In addition, the color filter 8B is formed on the upper sealing layer 63, the convex pattern 7, and the color filter 8G. In addition, the color filter 8R is formed on the upper sealing layer 63, the convex pattern 7, the color filter 8G, and the color filter 8B. That is, the convex pattern 7 between the pixel PxG and the pixel PxR is formed between the upper sealing layer 63 and the color filter 8G and between the upper sealing layer 63 and the color filter 8R. In addition, the convex pattern 7 between the pixel PxG and the pixel PxB is formed between the upper sealing layer 63 and the color filter 8B and between the upper sealing layer 63 and the color filter 8G. In addition, the convex pattern 7 between the pixel PxB and the pixel PxR is formed between the upper sealing layer 63 and the color filter 8B and between the upper sealing layer 63 and the color filter 8R.

Figure 11:
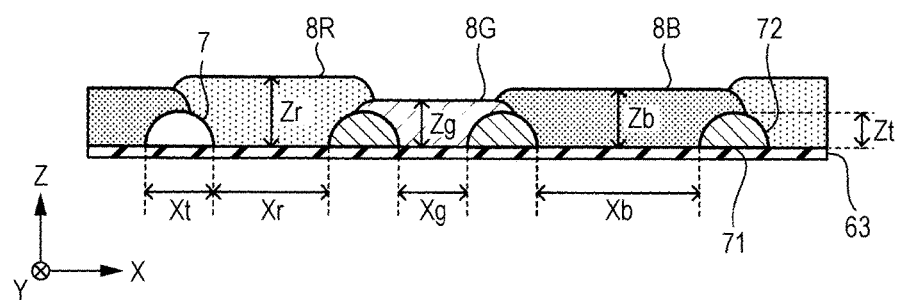
FIG. 11 is a partial cross-sectional view showing an example of the sizes of a convex pattern and a color filter layer according to the modification example 1.

FIG. 11 is an explanatory view for explaining the sizes (width and thickness) of the convex pattern 7 and the color filter layer 8. FIG. 11 is a view in which the convex pattern 7, the color filter layer 8, and the upper sealing layer 63 are extracted from the partial cross-sectional view shown in FIG. 10.

Figure 12:
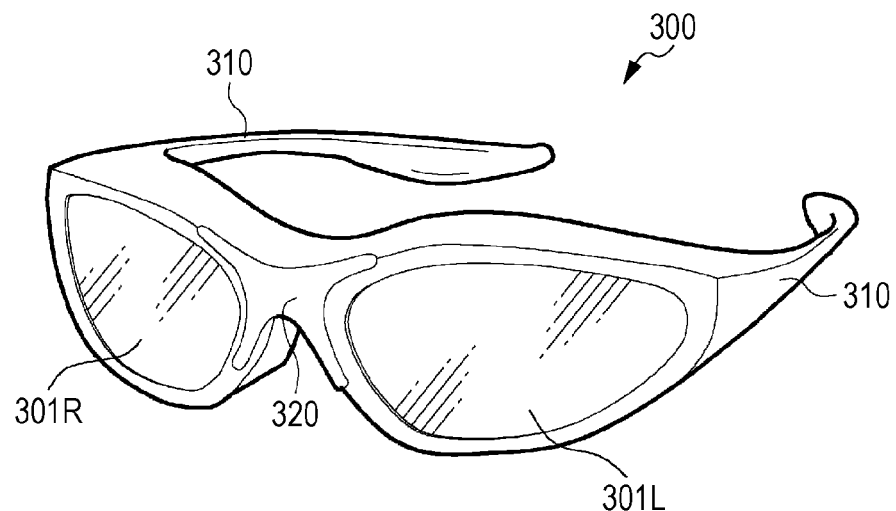
FIG. 12 is a perspective view of a head-mounted display according to the invention.

In this modification example, as shown in FIG. 12, the convex pattern 7 and the color filter layer 8 are formed so that the relationship shown in the following equation (3) is established between the maximum value Zt of the thickness of the convex pattern 7 in the Z-axis direction, a maximum value Zr of the thickness of the color filter 8R in the Z-axis direction, a maximum value Zg of the thickness of the color filter 8G in the Z axis direction, and a maximum value Zb of the thickness of the color filter 8B in the Z-axis direction.

$Zt<Zg<Zb<Zr$ (3)

In addition, in this modification example, as shown in FIG. 12, the convex pattern 7 and the color filter layer 8 are formed so that the relationship shown in the following equation (4) is established between a width Xt in the X-axis direction at a portion where the convex pattern 7 and the upper sealing layer 63 are in contact with each other, a width Xr in the X-axis direction at a portion where the color filter 8R and the upper sealing layer 63 are in contact with each other, a width Xg in the X-axis direction at a portion where the color filter 8G and the upper sealing layer 63 are in contact with each other, and a width Xb in the X-axis direction at a portion where the color filter 8B and the upper sealing layer 63 are in contact with each other.

$Xt<Xg<Xr<Xb$ (4)

As described above, in this modification example, the convex pattern 7 is provided between the sealing layer 60 and the color filter layer 8. As described above, the convex pattern 7 is mainly formed of a photosensitive resin material not containing a coloring material. Generally, the bonding strength of a resin material not containing a coloring material is stronger than the bonding strength of a resin material containing a coloring material. Therefore, as in this modification example, in a case where a constituent element (hereinafter, referred to as a "constituent on the sealing layer") formed on the sealing layer 60 includes the convex pattern 7 containing no coloring material in addition to the color filter layer 8 containing a coloring material, the bonding strength of the constituent on the sealing layer to the sealing layer 60 may be increased as compared with the case where the sealing layer 60 is formed only from the color filter layer 8 containing a coloring material.

Therefore, according to this modification example, in the manufacturing process of the electro-optical device 1 or the like, it is possible to reduce the possibility that the components on the sealing layer such as the color filter layer 8 peel off from the sealing layer 60.

In addition, in this modification example, the convex pattern 7 and the color filter layer 8 are formed using the same photosensitive resin material as a main component. Generally, the bonding strength between the constituent elements having the same main constituent is stronger than the bonding strength between constituent elements having different main constituents. Therefore, the bonding strength between the color filter layer 8 and the convex pattern 7 is stronger than the bonding strength between the color filter layer 8 and the sealing layer 60. Therefore, as in this modification example, since the constituent on the sealing layer has the convex pattern 7, it is possible to reduce the possibility that the color filter layer 8 peels off from the sealing layer 60.

In addition, in this modification example, the convex pattern 7 is formed so that the upper surface 72 is a curved surface. Then, in a case where the upper surface 72 of the convex pattern 7 is a curved surface, the adhesiveness between the color filter layer 8 formed on the upper surface 72 and the convex pattern 7 is higher as compared with the case where the upper surface 72 of the convex pattern 7 has a shape having a corner like a polyhedron. Therefore, according to this modification example, it is possible to strengthen the bonding strength of the convex pattern 7 and the color filter layer 8 as compared with the case where the upper surface 72 of the convex pattern 7 has a corner. In this way, it is possible to reduce the possibility that the color filter layer 8 peels off from the convex pattern 7 and the sealing layer 60.

Modification Example 2

In the embodiment and the modification examples described above, the color filter 8R is formed on at least a part of the color filter 8B after the color filter 8B is formed, but the invention is not limited to such an embodiment, and after the color filter 8R is formed, the color filter 8B may be formed on at least a part of the color filter 8R. That is, on the sealing layer 60, the color filter 8G may be formed first, the color filter 8R may be formed second, and the color filter 8B may be formed third.

In this modification example, the second formed color filter 8R is an example of the "second color filter", and the red light transmitted through the color filter 8R is an example of "the light of the second wavelength region". In addition, in this modification example, the third formed color filter 8B is an example of the "third color filter", and the blue light transmitted through the color filter 8B is an example of "the light of the third wavelength region".

Modification Example 3

In the embodiment and the modification examples described above, the color filter 8B and the color filter 8R are formed on at least a part of the color filter 8G after the color filter 8G is first formed on the sealing layer 60, but the invention is not limited to such an embodiment, and only one of the color filter 8B or the color filter 8R may be formed on at least a part of the color filter 8G after the color filter 8G is formed at the beginning.

C. APPLICATION EXAMPLE

The electro-optical device 1 according to the embodiment and the modification examples described above may be applied to various electronic apparatuses. Hereinafter, the electronic apparatus according to the aspect of the invention will be described.

FIG. 12 is a perspective view showing an appearance of a head-mounted display 300 as an electronic apparatus employing the electro-optical device 1 of the aspect of the invention. As shown in FIG. 12, the head-mounted display 300 includes a temple 310, a bridge 320, a projection optical system 301L, and a projection optical system 301R. Then, in FIG. 12, the electro-optical device 1 (not shown) for the left eye is provided behind the projection optical system 301L, and the electro-optical device 1 (not shown) for the right eye is provided behind the projection optical system 301R.

Figure 13:
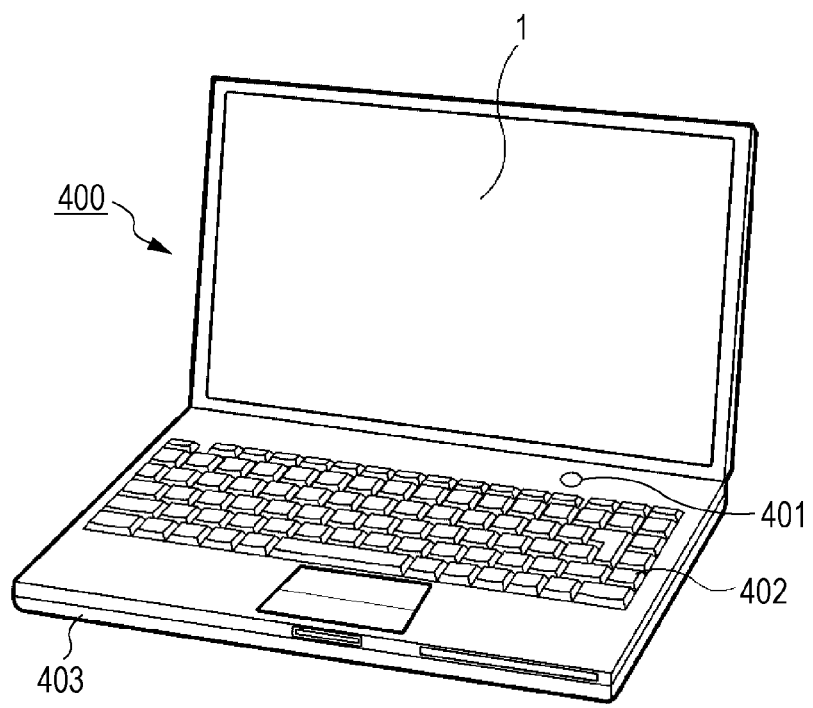
FIG. 13 is a perspective view of a personal computer according to the invention.

FIG. 13 is a perspective view of a portable personal computer 400 employing the electro-optical device 1. The personal computer 400 includes the electro-optical device 1 for displaying various images, and a main body unit 403 provided with a power switch 401 and a keyboard 402.

As an electronic apparatus to which the electro-optical device 1 according to the aspect of the invention is applied, in addition to the apparatuses exemplified in FIGS. 12 and 13, it is also possible to use a portable telephone, a smartphone, a personal digital assistant (PDA), a digital still camera, a television, a video camera, a car navigation device, an in-vehicle display device (instrument panel), an electronic notebook, an electronic paper, a calculator, a word processor, a workstation, a video phone, a POS terminal, and the like. Furthermore, the electro-optical device 1 according to the invention may be applied as a display unit provided in an electronic apparatus such as a printer, a scanner, a copying machine, and a video player.

The entire disclosure of Japanese Patent Application No. 2016-222730, filed Nov. 15, 2016 is expressly incorporated by reference herein.

What is claimed is:

1. An electro-optical device comprising:
a first pixel comprising:
a first light-emitting element; and
a first color filter that transmits green light;
a second pixel comprising:
a second light-emitting element; and
a second color filter that is formed on the first color filter and transmits blue light;
a third pixel comprising:
a third light-emitting element; and
a third color filter that is formed on the first and second color filters and transmits red light; and
a sealing layer that covers the first, second, and third light-emitting elements,
wherein the first color filter is first formed on the sealing layer, the second color filter is second formed on the sealing layer, the third color filter is third formed on the sealing layer, Zg is a maximum value of thickness of the first color filter, Zb is a maximum value of thickness of the second color filter, Zr is a maximum value of thickness of the third color filter, Xg is a width of the first pixel in an X-axis direction, Xb is a width of the second pixel in the X-axis direction, Xr is a width of the third pixel in the X-axis direction, and expressions (1) and (2) below are met:

$$Zg<Zb<Zr \tag{1}$$

$$Xg<Xr<Xb \tag{2}$$

2. The electro-optical device according to claim 1, further comprising:
a convex portion that is provided between the sealing layer and the first and second color filters.

3. The electro-optical device according to claim 2,
wherein the convex portion includes a light-transmitting photosensitive resin material, and
the first color filter includes a coloring material and the photosensitive resin material.

4. An electronic apparatus comprising:
the electro-optical device according to claim 3.

5. The electro-optical device according to claim 3,
wherein the second and third color filters include coloring material and the photosensitive resin material.

6. An electronic apparatus comprising:
the electro-optical device according to claim 2.

7. An electronic apparatus comprising:
the electro-optical device according to claim 1.

8. The electro-optical device according to claim 1, further comprising:
a convex portion that is provided between the sealing layer and the second and third color filters.

9. The electro-optical device according to claim 8,
wherein the convex portion includes a light-transmitting photosensitive resin material, and
the second and third color filters include coloring material and the photosensitive resin material.

10. A method for manufacturing an electro-optical device, comprising:
forming a first color filter that transmits green light on a sealing layer that covers a light-emitting element;
forming a second color filter that transmits blue light on the sealing layer and the first color filter; and
forming a third color filter that transmits red light on the sealing layer, the first color filter, and the second color filter,
wherein Zg is a maximum value of thickness of the first color filter, Zb is a maximum value of thickness of the second color filter, Zr is a maximum value of thickness of the third color filter, Xg is a width in an X-axis direction of a first pixel containing the first color filter, Xb is a width in the X-axis direction of a second pixel containing the second color filter, Xr is a width in the X-axis direction of a third pixel containing the third color filter, and expressions (1) and (2) below are met:

$$Zg<Zb<Zr \tag{1}$$

$$Xg<Xr<Xb \tag{2}$$

11. An electronic apparatus comprising:
the electro-optical device manufactured according to the method of claim 10.

* * * * *